United States Patent
Mao et al.

(10) Patent No.: US 11,228,313 B2
(45) Date of Patent: Jan. 18, 2022

(54) SIGNAL TRANSMISSION CIRCUIT

(71) Applicant: Realtek Semiconductor Corporation, Hsinchu (TW)

(72) Inventors: Wen-Yi Mao, Suzhou (CN); Li-Li Tan, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 113 days.

(21) Appl. No.: 16/878,952

(22) Filed: May 20, 2020

(65) Prior Publication Data

US 2021/0006248 A1 Jan. 7, 2021

(51) Int. Cl.
| | | |
|---|---|---|
| H03K 19/0175 | (2006.01) | |
| H03K 19/173 | (2006.01) | |
| G06F 13/40 | (2006.01) | |
| G06F 13/42 | (2006.01) | |
| H03K 19/0185 | (2006.01) | |
| H03K 19/17784 | (2020.01) | |
| H03K 19/017 | (2006.01) | |

(52) U.S. Cl.
CPC . *H03K 19/017509* (2013.01); *G06F 13/4068* (2013.01); *G06F 13/4282* (2013.01); *H03K 19/01742* (2013.01); *H03K 19/01855* (2013.01); *H03K 19/1737* (2013.01); *H03K 19/17784* (2013.01)

(58) Field of Classification Search
CPC ..... H03K 19/01742; H03K 19/017509; H03K 19/01855; H03K 19/09429; H03K 19/173; H03K 19/1733; H03K 19/1737; G06F 13/42; G06F 13/4282

USPC ...................................................... 326/56–58
See application file for complete search history.

(56) References Cited

U.S. PATENT DOCUMENTS

| | | | |
|---|---|---|---|
| 6,870,397 B1* | 3/2005 | Fox ................. | H03K 19/17744 326/37 |
| 7,010,639 B2 | 3/2006 | Larson et al. | |
| 2007/0283052 A1* | 12/2007 | Wojewoda ....... | H03K 19/17744 710/2 |
| 2008/0007294 A1* | 1/2008 | Chen .............. | H03K 19/017509 326/57 |
| 2021/0006248 A1* | 1/2021 | Mao ................. | G06F 13/4068 |

FOREIGN PATENT DOCUMENTS

TW 201310909 A 3/2013

* cited by examiner

*Primary Examiner* — Jason Crawford
(74) *Attorney, Agent, or Firm* — Locke Lord LLP; Tim Tingkang Xia, Esq.

(57) ABSTRACT

A signal transmission circuit is provided. A tri-state logic circuit includes an enabling terminal, an input terminal and an output terminal, and is conducted and unconducted when the enabling terminal is at a high and a low state respectively. A pull-up circuit pulls up a voltage level of the output terminal. A first and a second multiplexers respectively output an enabling signal and an output signal to the enabling terminal and the input terminal according to a first status of a selection signal and respectively output a high state signal according to a second status of the selection signal. A selection circuit generates the selection signal having the first status when the voltage level is not larger than a first threshold value, having the second status after the voltage level is larger than the first threshold value and having the first status afterwards.

14 Claims, 3 Drawing Sheets

SIGNAL TRANSMISSION CIRCUIT

RELATED APPLICATIONS

This application claims priority to China Application Serial Number 201910441355.7, filed May 24, 2019, which is herein incorporated by reference.

BACKGROUND

Field of Disclosure

The present disclosure relates to signal transmission technology. More particularly, the present disclosure relates to a signal transmission circuit.

Description of Related Art

Along with the development of the technology, I²C interface becomes common in the field of integrated circuits, e.g. system on a chip. I²C interface is the abbreviation of inter-integrated circuit bus that is designed by Philips Semiconductor to allow microprocessor or central processing units connecting to various low speed peripheral devices with less number of pins. However, when the signal transmission is performed by the signal transmission circuit of the integrated circuit equipped with I²C interface, the transition speed of the signals between the low state and the high state is easily affected by the design of the circuits. When the circuits are not well-designed, the transition speed is limited.

Accordingly, what is needed is a signal transmission circuit to address the above issues.

SUMMARY

An aspect of the present disclosure is to provide a signal transmission circuit that includes a tri-state logic circuit, a pull-up circuit, a first multiplexer, a second multiplexer and a selection circuit. The tri-state logic circuit includes an enabling terminal, an input terminal and an output terminal and is configured to be conducted when the enabling terminal is at a high state and unconducted when the enabling terminal is at a low state. The pull-up circuit is electrically coupled to the output terminal and is configured to pull up a voltage level of the output terminal. The first multiplexer and the second multiplexer are respectively configured to output an enabling signal to the enabling terminal and output an output signal having a low state to the input terminal according to a first status of a selection signal, and are respectively configured to output a high state signal to the enabling terminal and output the high state signal to the input terminal according to a second status of the selection signal opposite to the first status. The selection circuit is configured to generate the selection signal having the first status when the voltage level of the output terminal is not larger than a first threshold value, generate the selection signal having the second status during a conversion time period after the voltage level of the output terminal is larger than the first threshold value and generate the selection signal having the first status after the conversion time period.

Another aspect of the present disclosure is to provide a signal transmission method used in a signal transmission circuit that includes the steps outlined below. A selection signal having a first status is generated by a selection circuit when a voltage level of an output terminal of a tri-state logic circuit is not larger than a first threshold value. An enabling signal is outputted to an enabling terminal of the tri-state logic circuit and an output signal having a low state is outputted to an input terminal of the tri-state logic circuit according to the first status of the selection signal respectively by a first multiplexer and a second multiplexer. The enabling signal is converted from the high state to a low state such that the tri-state logic circuit is configured to be conducted when the enabling terminal is at the high state and unconducted when the enabling terminal is at the low state. The voltage level of the output terminal of the tri-state logic circuit is pulled up by a pull-up circuit. The selection signal having a second status opposite to the first status is generated by the selection circuit during a conversion time period after the voltage level of the output terminal is pulled up to be larger than the first threshold value by the pull-up circuit. A high state signal is outputted to the enabling terminal and the high state signal is outputted to the input terminal according to the second status of the selection signal respectively by the first multiplexer and the second multiplexer. The selection signal having the first status is generated after the conversion time period by the selection circuit. The enabling signal is outputted to the enabling terminal and the output signal is outputted to the input terminal according to the first status of the selection signal respectively by the first multiplexer and the second multiplexer.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
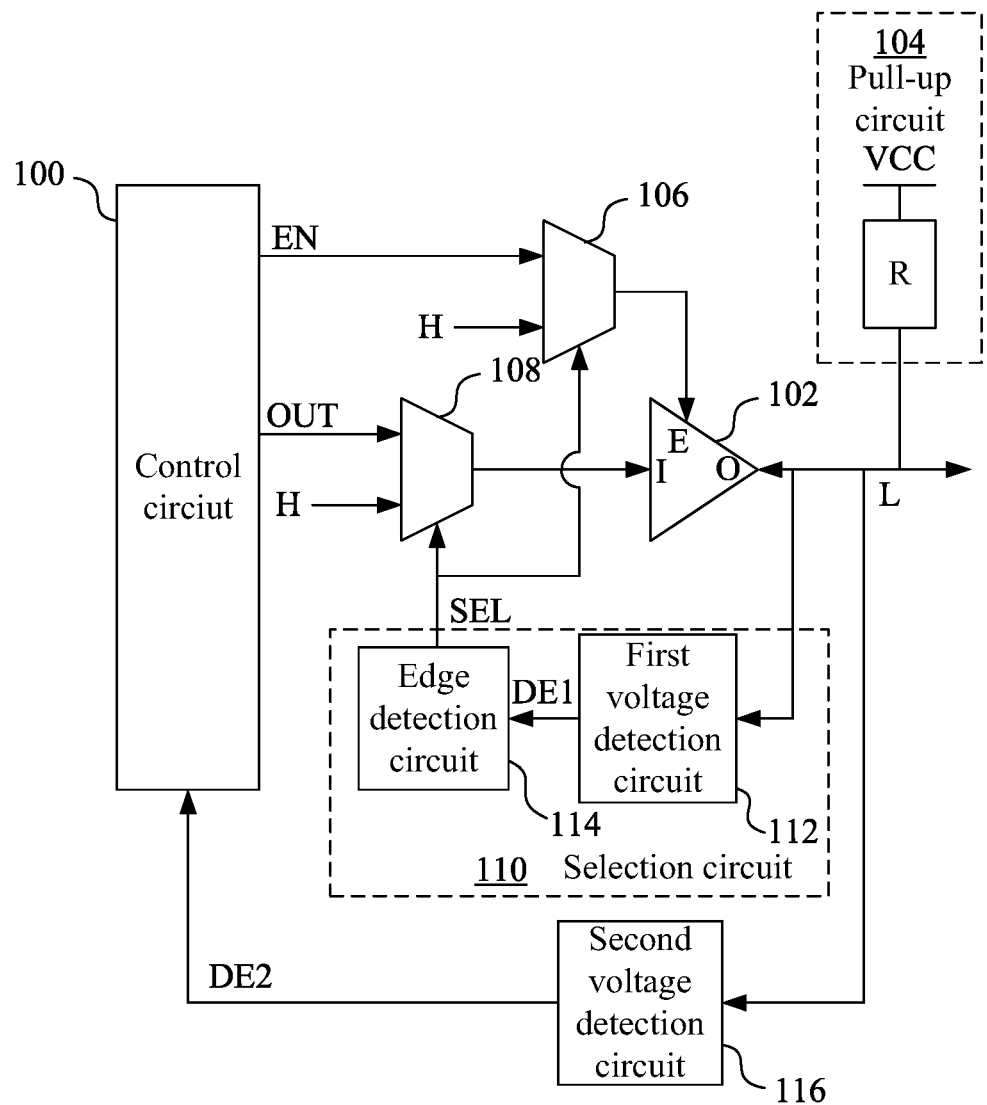
FIG. 1 is a block diagram of a signal transmission circuit in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Reference is now made to FIG. 1. FIG. 1 is a block diagram of a signal transmission circuit 1 in an embodiment of the present invention. In an embodiment, the signal transmission circuit 1 is disposed in an integrated circuit (not illustrated) and is electrically coupled to an external integrated circuit (not illustrated) through a wire L. In an embodiment, the wire L can be a serial data line (SDL) or a serial clock line (SCL) of I²C configuration. The signal transmission circuit 1 can thus be electrically coupled to the external integrated circuit through the I²C wire and perform such as, but not limited to transmission of a data signal or a clock signal according to the specification of I²C.

The signal transmission circuit 1 includes a control circuit 100, a tri-state logic circuit 102, a pull-up circuit 104, a first multiplexer 106, a second multiplexer 108 and a selection circuit 110.

The control circuit 100 is configured to generate an enabling signal EN and an output signal OUT.

The tri-state logic circuit 102 includes an enabling terminal E, an input terminal I and an output terminal O. The tri-state logic circuit 102 is configured to be conducted when the enabling terminal E is at a high state and unconducted when the enabling terminal E is at a low state.

The pull-up circuit 104 is electrically coupled to the output terminal O. In an embodiment, the pull-up circuit 104 includes a resistor R and a voltage source VCC. The resistor R is electrically coupled between the voltage source VCC and the output terminal O. As a result, the voltage source VCC is able to charge the output terminal O through the resistor R to pull up the voltage level of the output terminal O.

The first multiplexer 106 and the second multiplexer 108 respectively operate according to a selection signal SEL.

More specifically, the first multiplexer 106 has two input terminals respectively receive the enabling signal EN and a high state signal H and select one of the enabling signal EN and the high state signal H according to the selection signal SEL to output the selected signal to the enabling terminal E of the tri-state logic circuit 102. In an embodiment, when the selection signal SEL is at a first status, the first multiplexer 106 selects the enabling signal EN to be outputted. When the selection signal SEL is at a second status opposite to the first status, the first multiplexer 106 selects the high state signal H to be outputted.

On the other hand, the second multiplexer 108 has two input terminals respectively receive the output signal OUT and the high state signal H and select one of the output signal OUT and the high state signal H according to the selection signal SEL to output the selected signal to the input terminal I of the tri-state logic circuit 102. In an embodiment, when the selection signal SEL is at the first status, the second multiplexer 108 selects the output signal OUT to be outputted. When the selection signal SEL is at the second status opposite to the first status, the second multiplexer 108 selects the high state signal H to be outputted.

In an example, the first status of the selection signal SEL is the low status. The second status of the selection signal SEL is the high status. However, the present invention is not limited thereto.

In an embodiment, the selection circuit 110 includes a first voltage detection circuit 112 and an edge detection circuit 114.

The first voltage detection circuit 112 is configured to detect the voltage level of the output terminal O and generate a first detection signal DE1. The first detection signal DE1 is at the low state when the voltage level is not larger than the first threshold value and is at the high state when the voltage level is larger than the first threshold value.

The edge detection circuit 114 is configured to detect a transition point of the first detection signal DE1 from the low state to the high state and further generate the selection signal SEL having the first status when the voltage level of the output terminal O is not larger than a first threshold value, generate the selection signal SEL at the second status in the conversion time period after the transition point and generate the selection signal at the first status outside of the conversion time period. In an embodiment, the edge detection circuit 114 generates a high state signal similar to a pulse within the conversion time period. The length of the high state signal similar to the pulse can be such as, but not limited 10 nano-seconds to 200 nano-seconds.

Figure 2:
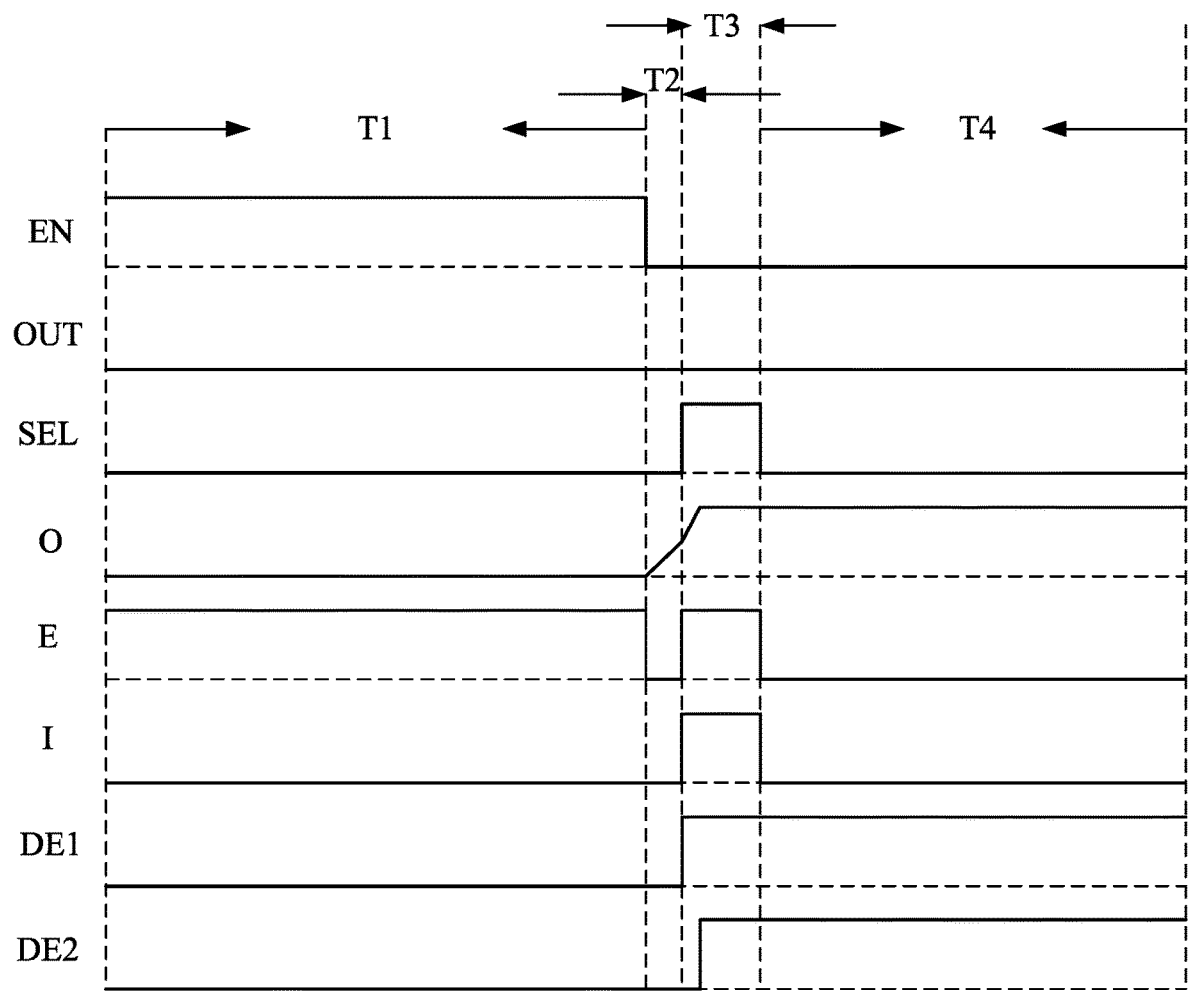
FIG. 2 is a timing diagram of the signals and the voltage levels of the terminals of the signal transmission circuit in an embodiment of the present invention.

Reference is now made to FIG. 2. FIG. 2 is a timing diagram of the signals and the voltage levels of the terminals of the signal transmission circuit 1 in an embodiment of the present invention. The operation of the signal transmission circuit 1 is described in detail along with the timing, the signal and the voltage levels of the terminals.

As illustrated in FIG. 2, in the time period T1, the enabling signal EN is at the high state, the output signal OUT is at the low state and the selection signal SEL is at the first status. The first multiplexer 106 and the second multiplexer 108 respectively generates the enabling signal EN and the output signal OUT having the low state to the enabling terminal E and the input terminal I of the tri-state logic circuit 102 according to the selection signal SEL having the first status.

As a result, the tri-state logic circuit 102 is conducted to receive the output signal OUT from the input terminal I and output the output signal OUT having the low state to the output terminal O. Under such a condition, since the pull-up ability of the pull-up circuit 104 is not sufficient, the output terminal O is at the low state. As a result, the first voltage detection circuit 112 detects the condition that the voltage level of the output terminal O is not larger than the first threshold and further outputs the first detection signal DE1 having the low state. The edge detection circuit 114 does not detect the transition point and output the selection signal SEL having the first status.

Subsequently, in the time period T2, the enabling signal EN turns to the low state and the selection signal SEL is still at the first status. The first multiplexer 106 and the second multiplexer 108 respectively generates the enabling signal EN and the output signal OUT having the low state to the enabling terminal E and the input terminal I of the tri-state logic circuit 102 according to the selection signal SEL having the first status.

Under such a condition, the tri-state logic circuit 102 is unconducted such that the output terminal O does not receive the output signal OUT from the input terminal I. As a result, the pull-up circuit 104 pulls up the voltage level of the output terminal O. When the voltage level of the output terminal O is no larger than the first threshold value, the first voltage detection circuit 112 still outputs the first detection signal DE1 having the low state such that the edge detection circuit 114 outputs the selection signal SEL at the first status.

In the time period T3, under the pull up of the pull-up circuit 104, the first voltage detection circuit 112 detects the condition that the voltage level of the output terminal O is larger than the first threshold value to generate the first detection signal DE1 having the high state. The edge detection circuit 114 detects the transition point of the first detection signal DE1 from the low state to the high state and further generates the detection signal SEL having the second status in the conversion time period after the transition point, i.e. the time period T3.

In an embodiment, the conversion time period has a length of such as, but not limited to 10 nano-seconds to 200 nano-seconds. As a result, taking the condition that the second status is the high state as an example, the edge detection circuit 114 outputs the selection signal SEL to generate the high state signal similar to a pulse within the conversion time period. The first multiplexer 106 and the second multiplexer 108 respectively output the high state signal H to the enabling terminal E and the input terminal I of the tri-state logic circuit 102 such that the tri-state logic circuit 102 is conducted to transmit the high state signal H from the input terminal I to the output terminal O. Within a short time period after the time period T3 begins, a rapid voltage pull-up procedure pulls the voltage level of the output terminal O to the high state. It is appreciated that in order to perform observation in FIG. 2, the waveform is illustrated to be wider. In practical implementation, the pull-up procedure of the voltage level of the output terminal O can be within an even shorter time period to form a steeper curve.

In the time period T4, i.e. after the conversion time period, the first voltage detection circuit 112 still detects the voltage level of the output terminal O larger than the first threshold and outputs the first detection signal DE1 having the high state. However, the edge detection circuit 114 does not detect the transition point and generates the selection signal SEL having the first status.

Under such a condition, the first multiplexer 106 and the second multiplexer 108 respectively output the enabling signal EN and the output signal OUT having the low state to the enabling terminal E and the input terminal I of the tri-state logic circuit 102 according to the first status of the selection signal SEL. Since the enabling signal EN is still at the low state, the tri-state logic circuit 102 is unconducted such that the output terminal O does not receive the output signal OUT from the input terminal I. As a result, the pull-up circuit 104 can maintain the high state of the output terminal O.

After the time period T4, the signal transmission circuit 1 goes back to the status in the time period T1 when the enabling signal EN turns to the high state and operates to output the voltage level having the low state at the output terminal O.

In an embodiment, the voltage level at the output terminal O of the signal transmission circuit 1 becomes a data signal or a clock signal and is transmitted to the external integrated circuit through the wire L.

In an embodiment, the signal transmission circuit 1 further includes a second voltage detection circuit 116 configured to detect the voltage level of the output terminal O and generate a second detection signal DE2 to the control circuit 100. The second detection signal DE2 is at the low state when the voltage level is not larger than a second threshold value and is at the high state when the voltage level is larger than the second threshold value, wherein the second threshold value is larger than the first threshold value. In an embodiment, the time spot that the second detection signal DE2 becomes high state is equivalent to the time spot that the voltage level of the output terminal O reaches the high state. In an embodiment, the control circuit 100 determines whether the output terminal O outputs the high state according to the second detection signal DE2.

In some approaches, the signal transmission circuit only uses pull-up circuit 104 to turn the output terminal O to be the high state. However, the pull up ability of the pull-up circuit 104 is determined by the time constant related to the resistor R and the capacitor of the wire such that the output terminal O is not able to turn to the high state rapidly. If the resistance of the resistor R is lowered to increase the operation speed, the average power dissipation of the signal transmission circuit increases.

As a result, the signal transmission circuit 1 of the present invention can turn the voltage of the output terminal O from the low state to the high state rapidly by using a configuration of the first multiplexer 106 and the second multiplexer 108. The configuration of the first multiplexer 106 and the second multiplexer 108 makes the tri-state logic circuit 102 to be conducted to output the high state signal H after the voltage level of the output terminal O is pulled up by the pull-up circuit 104 for a certain period of time.

Figure 3:
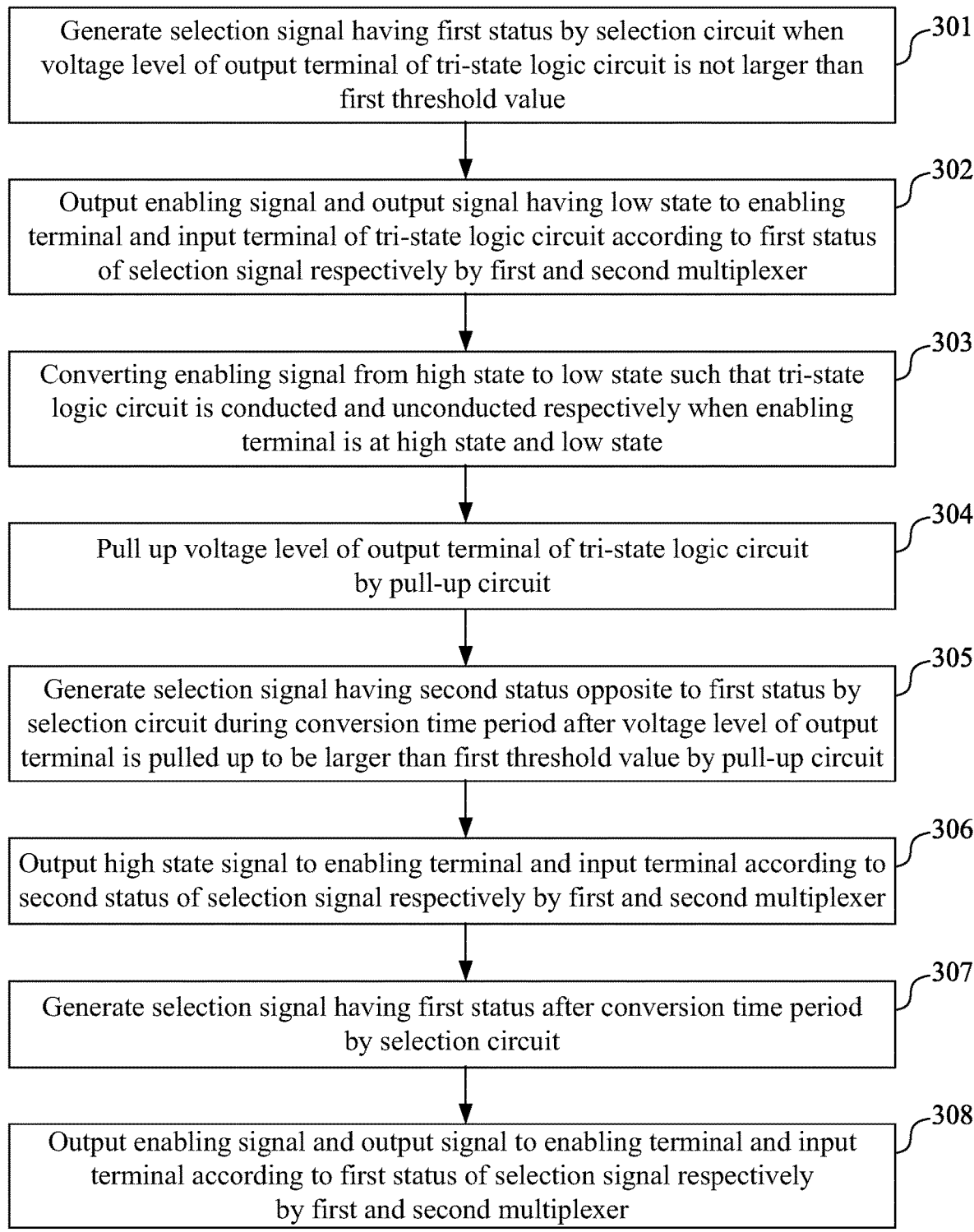
FIG. 3 is a flow chart of a signal transmission method in an embodiment of the present invention.

Reference is now made to FIG. 3. FIG. 3 is a flow chart of a signal transmission method 300 in an embodiment of the present invention. The signal transmission method 300 can be used in the signal transmission circuit 1 illustrated in FIG. 1. The signal transmission method 300 includes the steps outlined below (The steps are not recited in the sequence in which the operations are performed. That is, unless the sequence of the operations is expressly indicated, the sequence of the steps is interchangeable, and all or part of the steps may be simultaneously, partially simultaneously, or sequentially performed).

In step 301, the selection signal SEL having the first status is generated by the selection circuit 110 when the voltage level of the output terminal O of the tri-state logic circuit 100 is not larger than the first threshold value.

In step 302, the enabling signal EN is outputted to the enabling terminal E of the tri-state logic circuit 100 and the output signal OUT having the low state is outputted to the input terminal I of the tri-state logic circuit 100 according to the first status of the selection signal SEL respectively by the first multiplexer 106 and the second multiplexer 108.

In step 303, the enabling signal EN is converted from the high state to a low state such that the tri-state logic circuit 100 is configured to be conducted when the enabling terminal E is at the high state and unconducted when the enabling terminal E is at the low state.

In step 304, the voltage level of the output terminal O of the tri-state logic circuit 100 is pulled up by the pull-up circuit 104.

In step 305, the selection signal SEL having the second status opposite to the first status is generated by the selection circuit 110 during the conversion time period after the voltage level of the output terminal O is pulled up to be larger than the first threshold value by the pull-up circuit 104.

In step 306, the high state signal H is outputted to the enabling terminal E and the high state signal H is outputted to the input terminal I according to the second status of the selection signal SEL respectively by the first multiplexer 106 and the second multiplexer 108.

In step 307, the selection signal SEL having the first status is generated after the conversion time period by the selection circuit 110.

In step 308, the enabling signal EN is outputted to the enabling terminal E and the output signal OUT is outputted to the input terminal I according to the first status of the selection signal SEL respectively by the first multiplexer 106 and the second multiplexer 108.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A signal transmission circuit, comprising:
a tri-state logic circuit comprising an enabling terminal, an input terminal and an output terminal and configured to be conducted when the enabling terminal is at a high state and unconducted when the enabling terminal is at a low state;
a pull-up circuit electrically coupled to the output terminal and configured to pull up a voltage level of the output terminal;
a first multiplexer and a second multiplexer respectively configured to output an enabling signal to the enabling terminal and output an output signal having a low state to the input terminal according to a first status of a selection signal, and respectively configured to output a high state signal to the enabling terminal and output the high state signal to the input terminal according to a second status of the selection signal opposite to the first status; and a selection circuit configured to generate the selection signal having the first status when the voltage level of the output terminal is not larger than a first threshold value, generate the selection signal having the second status during a conversion time period after the voltage level of the output terminal is larger than the first threshold value and generate the selection signal having the first status after the conversion time period.

2. The signal transmission circuit of claim 1, wherein when the enabling signal is at the high state, the output signal is at the low state and the selection signal is at the first status, the tri-state logic circuit is conducted to receive the output signal from the input terminal and generate the output signal having the low state to the output terminal;

when the enabling signal is at the low state and the selection signal is at the first status, the tri-state logic circuit is unconducted and the pull-up circuit pulls up the voltage level of the output terminal, the selection circuit generates the selection signal having the second status during the conversion time period such that the tri-state logic circuit is conducted to output the high state signal to the output terminal such that the voltage level of the output terminals becomes the high state, and the selection circuit generates the selection signal having the first status after the conversion time period such that the tri-state logic circuit is unconducted and the pull-up circuit maintains the voltage level of the output terminals.

3. The signal transmission circuit of claim 1, wherein the selection circuit comprises:

a first voltage detection circuit configured to detect the voltage level of the output terminal and generate a first detection signal, wherein the first detection signal is at the low state when the voltage level of the output terminal is not larger than the first threshold value and is at the high state when the voltage level of the output terminal is larger than the first threshold value; and an edge detection circuit configured to detect a transition point of the first detection signal from the low state to the high state and further generate the selection signal at the second status in the conversion time period after the transition point and generate the selection signal at the first status outside of the conversion time period.

4. The signal transmission circuit of claim 1, further comprising:

a control circuit configured to generate the enabling signal and the output signal; and a second voltage detection circuit configured to detect the voltage level of the output terminal and generate a second detection signal to the control circuit, wherein the second detection signal is at the low state when the voltage level of the output terminal is not larger than a second threshold value and is at the high state when the voltage level of the output terminal is larger than the second threshold value, wherein the second threshold value is larger than the first threshold value;

wherein the control circuit is further configured to determine whether the voltage level of the output terminal turns to the high state according to the second detection signal.

5. The signal transmission circuit of claim 1, wherein the output terminal is electrically coupled to an I²C wire and the output terminal is electrically coupled to an external integrated circuit through the I²C wire.

6. The signal transmission circuit of claim 1, wherein the pull-up circuit comprises a resistor and a voltage source, wherein the resistor is electrically coupled between the voltage source and the output terminal such that the voltage source charges the output terminal through the resistor.

7. The signal transmission circuit of claim 1, wherein the output terminal of the tri-state logic circuit outputs a data signal or a clock signal according to a specification of I²C.

8. A signal transmission method used in a signal transmission circuit, comprising:

generating a selection signal having a first status by a selection circuit when a voltage level of an output terminal of a tri-state logic circuit is not larger than a first threshold value;

respectively outputting an enabling signal to an enabling terminal of the tri-state logic circuit and outputting an output signal having a low state to an input terminal of the tri-state logic circuit according to the first status of the selection signal by a first multiplexer and a second multiplexer;

converting the enabling signal from the high state to a low state such that the tri-state logic circuit is configured to be conducted when the enabling terminal is at the high state and unconducted when the enabling terminal is at the low state;

pulling up the voltage level of the output terminal of the tri-state logic circuit by a pull-up circuit;

generating the selection signal having a second status opposite to the first status by the selection circuit during a conversion time period after the voltage level of the output terminal is pulled up to be larger than the first threshold value by the pull-up circuit;

respectively outputting a high state signal to the enabling terminal and outputting the high state signal to the input terminal according to the second status of the selection signal by the first multiplexer and the second multiplexer;

generating the selection signal having the first status after the conversion time period by the selection circuit; and respectively outputting the enabling signal to the enabling terminal and outputting the output signal to the input terminal according to the first status of the selection signal by the first multiplexer and the second multiplexer.

9. The signal transmission method of claim 8, further comprising:

when the enabling signal is at the high state, the output signal is at the low state and the selection signal is at the first status, the tri-state logic circuit is conducted to receive the output signal from the input terminal and generate the output signal having the low state to the output terminal;

when the enabling signal is at the low state and the selection signal is at the first status, the tri-state logic circuit is unconducted and the pull-up circuit pulls up the voltage level of the output terminal, the selection circuit generates the selection signal having the second status during the conversion time period such that the tri-state logic circuit is conducted to output the high state signal to the output terminal such that the voltage level of the output terminals becomes the high state, and the selection circuit generates the selection signal having the first status after the conversion time period such that the tri-state logic circuit is unconducted and the pull-up circuit maintains the voltage level of the output terminals.

10. The signal transmission method of claim 8, further comprising:

detecting the voltage level of the output terminal and generating a first detection signal by a first voltage detection circuit comprised by the selection circuit, wherein the first detection signal is at the low state when the voltage level of the output terminal is not larger than the first threshold value and is at the high state when the voltage level of the output terminal is larger than the first threshold value; and detecting a transition point of the first detection signal from the low state to the high state and further generating the selection signal at the second status in the conversion time period after the transition point and generating the selection signal at the first status outside of the conversion time period by an edge detection circuit comprised by the selection circuit.

11. The signal transmission method of claim 8, further comprising:

generating the enabling signal and the output signal by a control circuit;

detecting the voltage level of the output terminal and generating a second detection signal to the control circuit by a second voltage detection circuit, wherein the second detection signal is at the low state when the voltage level of the output terminal is not larger than a second threshold value and is at the high state when the voltage level of the output terminal is larger than the second threshold value, wherein the second threshold value is larger than the first threshold value; and determining whether the voltage level of the output terminal turns to the high state according to the second detection signal by the control circuit.

12. The signal transmission method of claim 8, wherein the output terminal is electrically coupled to an I$^2$C wire and the output terminal is electrically coupled to an external integrated circuit through the I$^2$C wire.

13. The signal transmission method of claim 8, wherein the pull-up circuit comprises a resistor and a voltage source, wherein the resistor is electrically coupled between the voltage source and the output terminal such that the voltage source charges the output terminal through the resistor.

14. The signal transmission method of claim 8, further comprising:

outputting a data signal or a clock signal according to a specification of I$^2$C through the output terminal of the tri-state logic circuit.

* * * * *